United States Patent [19]

Tallman et al.

[11] Patent Number: 5,025,411

[45] Date of Patent: Jun. 18, 1991

[54] METHOD WHICH PROVIDES DEBOUNCED INPUTS FROM A TOUCH SCREEN PANEL BY WAITING UNTIL EACH X AND Y COORDINATES STOP ALTERING

[75] Inventors: James L. Tallman, Hillsboro; Terry G. Sherbeck, Aloha, both of Oreg.

[73] Assignee: Tektronix, Inc., Beaverton, Oreg.

[21] Appl. No.: 939,645

[22] Filed: Dec. 8, 1986

[51] Int. Cl.[5] .................... G06F 3/037; G06F 3/033; G09G 1/16; G06K 11/06

[52] U.S. Cl. ................. 364/900; 364/927.2; 364/927.6; 364/927.64; 364/928; 364/934; 364/941; 364/941.1; 340/706

[58] Field of Search ............. 364/300, 900 MS File, 364/200 MS File; 340/706, 711, 712, 731, 747, 702, 738, 752, 762, 766

[56] References Cited

U.S. PATENT DOCUMENTS

| | | | |
|---|---|---|---|
| 4,313,109 | 1/1982 | Funk et al. | 340/365 P |
| 4,517,559 | 5/1985 | Deitch et al. | 340/712 |
| 4,521,870 | 6/1985 | Babbel et al. | 364/900 |
| 4,527,250 | 7/1985 | Galdun et al. | 364/900 |
| 4,578,640 | 3/1986 | Crooke et al. | 340/731 |
| 4,634,970 | 1/1987 | Payne et al. | 340/720 |
| 4,672,364 | 6/1987 | Lucas | 340/365 |
| 4,679,137 | 7/1987 | Lane et al. | 364/188 |
| 4,684,801 | 8/1987 | Carroll et al. | 250/221 |
| 4,695,827 | 9/1987 | Beining et al. | 340/365 |
| 4,703,316 | 10/1987 | Sherbeck | 340/706 |

FOREIGN PATENT DOCUMENTS

WO85505477 12/1985 European Pat. Off. ............ 340/712

OTHER PUBLICATIONS

Ciarcia, S., "Chapter 5 the Basic Peripherals", in: Build Your Own Z80 Computer, (New Hampshire, Peterborough, 1981), pp. 130–134.

*Primary Examiner*—Archie E. Williams, Jr.
*Assistant Examiner*—Robert B. Harrell
*Attorney, Agent, or Firm*—Daniel J. Bedell; Peter J. Meza

[57] ABSTRACT

A system for providing input to a computer comprises a touchscreen apparatus for generating a grid of horizontal and vertical light beams and producing a set of output signals, each indicating whether a corresponding one of the light beams strikes an object. A scanning device repeatedly scans the states of the output signals, stores data representing the last scanned state of each output signal, and transmits a first interrupt signal to the computer whenever the state of any one of the output signals changes. In response to the interrupt signal, the computer reads the stored scan data, determines whether the data indicates that a horizontal and a vertical light beam is striking an object, and if so, sets parameter values to identify the horizontal and vertical light beams. In response to a second interrupt signal periodically generated by a clock, the computer determines whether or not the parameter values have remained constant for a predetermined period, and if so executes a routine responsive to the parameter values.

2 Claims, 5 Drawing Sheets

METHOD WHICH PROVIDES DEBOUNCED INPUTS FROM A TOUCH SCREEN PANEL BY WAITING UNTIL EACH X AND Y COORDINATES STOP ALTERING

BACKGROUND OF THE INVENTION

The present invention relates in general to computer input systems and in particular to a system for acquiring and validating computer input data produced by a touchscreen.

A touchscreen typically comprises a set of photodetectors and a set of light emitting diodes (LEDs), one LED corresponding to each photodetector. The photodetectors and LEDs are distributed along the edges of a computer terminal screen with each LED and its corresponding photodetector being mounted on opposite edges of the screen so that each LED transmits a beam of light across the screen to its corresponding photodetector. The LEDs and photodetectors are arranged so that some light beams produced by the LEDs traverse the screen in a vertical direction while other light beams traverse the screen in a horizontal direction. The horizontal and vertical light beams are spaced so as to form a regular, rectangular grid in front of the screen. Parallel beams are close enough together so that when an operator touches the screen with a finger, the finger usually prevents at least one vertical beam and at least one horizontal beam from striking its corresponding photodetector. Each photodetector produces an output signal of a high or low logic state depending on whether or not it detects the corresponding light beam, and the position of the operator's finger on the screen can be ascertained from the state of the photodetector output signals, provided the finger intercepts at least one horizontal and one vertical beam.

Touchscreen systems are commonly used in computerized systems such as digital oscilloscopes which display menus on a screen because a touchscreen permits an operator to make a menu selection by directly touching a selectable item on the displayed menu rather than, for example, by depressing a pushbutton elsewhere on the oscilloscope. In such an application, a touchscreen not only eliminates or reduces the need for pushbuttons, it also tends to reduce opportunity for operator error since menu item selection is direct and intuitive.

Typically an interface device responsive to the output signal produced by each photodetector will store data indicating the state of each photodetector in a memory device. Touchscreen systems of the prior art typically utilize either of two methods for transferring the stored touchscreen state data to a computer so that the computer can determine from this data when and where the screen is being touched or "untouched". According to a "clocked" method of the prior art, the computer periodically reads the stored touchscreen data, determines whether any change in the data has taken place and takes appropriate action. According to an "interrupt" method of the prior art, the interface device includes provisions for determining when a change has occurred in the touchscreen data and sends an interrupt signal to the computer indicating a change in the touchscreen data. The computer then reads the data stored in the memory device to determine how the state of the touchscreen output signals have changed and then takes appropriate action.

In order to provide prompt response to operator input, it is necessary when utilizing the clocked method to read the touchscreen state data fairly often. Since the process of reading and analyzing all the data typically takes a substantial amount of processing time, the processing time overhead in monitoring the touchscreen is fairly high. In applications where operator input through the touchscreen is relatively infrequent, the computer processing time overhead for handling touchscreen input can be reduced by utilizing the interrupt method because the computer reads and processes touchscreen data only when the operator has just touched or "untouched" the touchscreen. However the interrupt method can be troublesome. An operator's finger normally shakes no matter how steady he tries to hold it, and when the edge of operator's finger is close to one or more beams, this normal vibration of the finger can cause the finger to intermittently intercept the beams. This in turn causes the scanning device to repeatedly interrupt the computer to tell the computer that the operator has changed the touchscreen input. The computer responds as if the operator were making repeated, alternative touchscreen input selections and may carry out a succession of actions unintended by the operator. The computer may also carry out an unintended succession of actions when the operator rapidly moves his finger across the screen without first moving his finger out of the light beam grid.

What is needed is a method for providing touchscreen state data input to a computer which does not utilize large amounts of computer overhead during periods when an operator is not touching a touchscreen or when an operator's finger causes the data to change several times in rapid succession.

SUMMARY OF THE INVENTION

A touchscreen input device for a computer comprises a set of photodetectors and a corresponding set of light emitting diodes (LEDs) arranged so that some light beams produced by the LEDs traverse an instrument screen in a vertical direction while other light beams traverse the screen in a horizontal direction. The horizontal and vertical light beams are regularly spaced so as to form a regular, rectangular grid in front of the screen. When an operator touches the screen with his or her finger, the finger may prevent vertical and horizontal light beams from striking photodetectors mounted on the edges of the screen opposite the corresponding LEDs. Each photodetector produces a signal of a high or low logic state depending on whether or not it detects the presence of a beam. A scanning device repeatedly scans the state of each photodetector output signal and stores data indicating the state of each photodetector output signal in a memory device. Whenever the state of data in the memory devices changes, the scanning device sends a touchscreen interrupt signal to the computer.

In accordance with the present invention, on the computer's receipt of the touchscreen interrupt signal from the scanner, the computer executes a touchscreen interrupt routine which causes the computer to read the touchscreen data from the memory device, to determine from the data whether the operator is touching the screen, to determine from the data horizontal and vertical (X and Y) screen coordinates of the operator's finger, and to set the value of stored screen coordinate parameters accordingly. The touchscreen interrupt routine then ends without causing the computer to respond in any further manner to the change in the touchscreen data.

The computer is also programmed to execute a "clocked" interrupt routine whenever it receives an interrupt signal produced by a clock circuit. The clocked interrupt routine causes the computer to determine whether the values of he screen coordinate parameters have remained constant during a predetermined period. If so, the clocked interrupt routine causes the computer to place a command in a queue indicating the values of the coordinate parameters. Commands in the queue cause the computer to "respond" to screen touches by executing routines responsive to the coordinate parameter values indicating the location of the screen touch, and the commands are executed in the order that they ar stored in the queue.

Thus according to the present invention, the computer handles data from the touchscreen scanner utilizing two interrupt routines. In the touchscreen interrupt routine, initiated when the scanner interrupts the computer in response to a change in state of a touchscreen output signal, the computer reads the touchscreen data and makes note of the coordinates of the screen touch. In the clocked interrupt routine, the computer determines if the current touch coordinates have remained the same for a predetermined period, and if so, enqueues a command which causes the computer to subsequently carry out an action appropriate to the coordinates of the screen touch. Thus the touchscreen input data must remain constant for a predetermined period in order for a screen touch to be considered "valid", and the chances of enqueuing a succession of touchscreen inputs when an operator's finger intermittently intercepts one or more light beams are minimized.

The present invention is suitable for use in conjunction with a digital oscilloscope of the type wherein aspects of oscilloscope operation may be controlled by an operator utilizing the touchscreen to make selections from menus displayed on the oscilloscope screen. In such a digital oscilloscope, an internal computer which controls update of waveform displays in response to changes in input signals may also control the display of menus on the screen as well as the oscilloscope's response to touchscreen selections made from such menus. In order to provide apparent real-time waveform display update response to changes in oscilloscope input signals, it is beneficial to minimize the amount of processing time expended monitoring the touchscreen when the operator is not using it.

The touchscreen interrupt routine utilizes relatively more processing time than the clocked interrupt routine because it requires the computer to acquire a comparatively larger amount of data and requires the computer to process all of the touchscreen data to determine the coordinates of the current screen touch. The clocked interrupt routine utilizes relatively little computer processing time because it requires the computer to make comparatively few memory accesses and to execute relatively few lines of code. When the operator is not accessing the touchscreen, the computer periodically executes the short clocked interrupt routine but does not execute the long touchscreen interrupt routine. Thus the processing time expended on touchscreen monitoring is minimized during periods when high speed update of waveform displays is most desirable. On the other hand, when the operator is engaged in reconfiguring oscilloscope operation by making selections from menus displayed on the screen, the speed with which waveform displays are updated is not particularly important since the waveforms may be covered by menus and since the operator's attention is directed to menus and not to waveforms. Thus the additional processing time required to execute the touchscreen interrupt routines when the operator is accessing the touchscreen does not degrade the real-time performance of the oscilloscope as perceived by the operator when the operator is not accessing the touchscreen.

It is accordingly an object of the invention to provide a new and improved system by which a computer monitors and responds to input from a touchscreen which system minimizes the processing time required for monitoring the touchscreen when the touchscreen is not being accessed.

It is another object of the invention to provide a new and improved system by which a computer validates output signals produced by a touchscreen so as to limit its response to intermittent, unintended changes in touchscreen output signals.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DESCRIPTION OF THE PREFERRED EMBODIMENT

Figure 1:
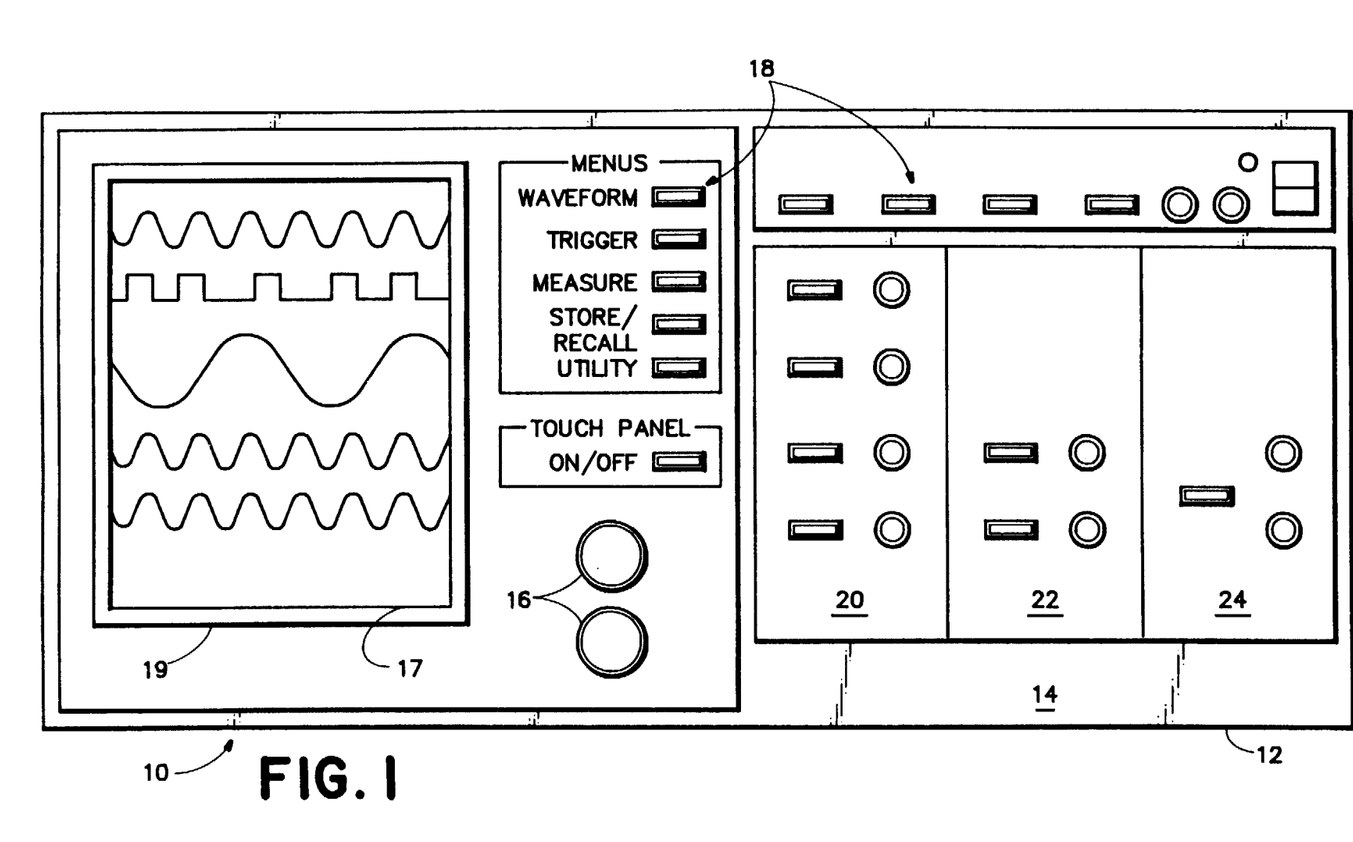
FIG. 1 is a front elevation view of an oscilloscope suitable for utilizing the present invention.

The present invention relates to a system for monitoring and validating operations of a touchscreen of the type suitable for providing input to an instrument such as a computer-based digital oscilloscope. FIG. 1 depicts a front elevation view of such a computer-based digital oscilloscope 10 including a main chassis 12, a front panel 14 mounted on the chassis, control knobs 16, a screen 17 and pushbuttons 18 mounted on the front panel, as well as a set of three "plugins" 20, 22 and 24. Each plugin comprises a hardware subsystem of the oscilloscope mounted on a small, removable chassis "plugged" into main chassis 12 through a corresponding slot in front panel 14. The plugin hardware subsystems, interconnected with other hardware within chassis 12 through backplane wiring in chassis 12, may include vertical channel amplifiers, trigger systems and other equipment. Each plugin includes an individual front panel on which additional pushbuttons, control knobs and jacks may be mounted. The screen 17 displays waveforms, menus, data and other graphics and text produced by the oscilloscope, and includes a "touchscreen" 19, a mechanism comprising rows of light sources and light sensors distributed around the edge of the screen 17 for providing input data to the oscilloscope indicating locations on the screen touched by an operator's finger. The touchscreen 19 is useful, for example, in permitting an operator to make selections from menus displayed on the screen, which menu selections cause the oscilloscope to change various aspects of its operation. The touchscreen is described in more detail hereinbelow.

Figure 2:
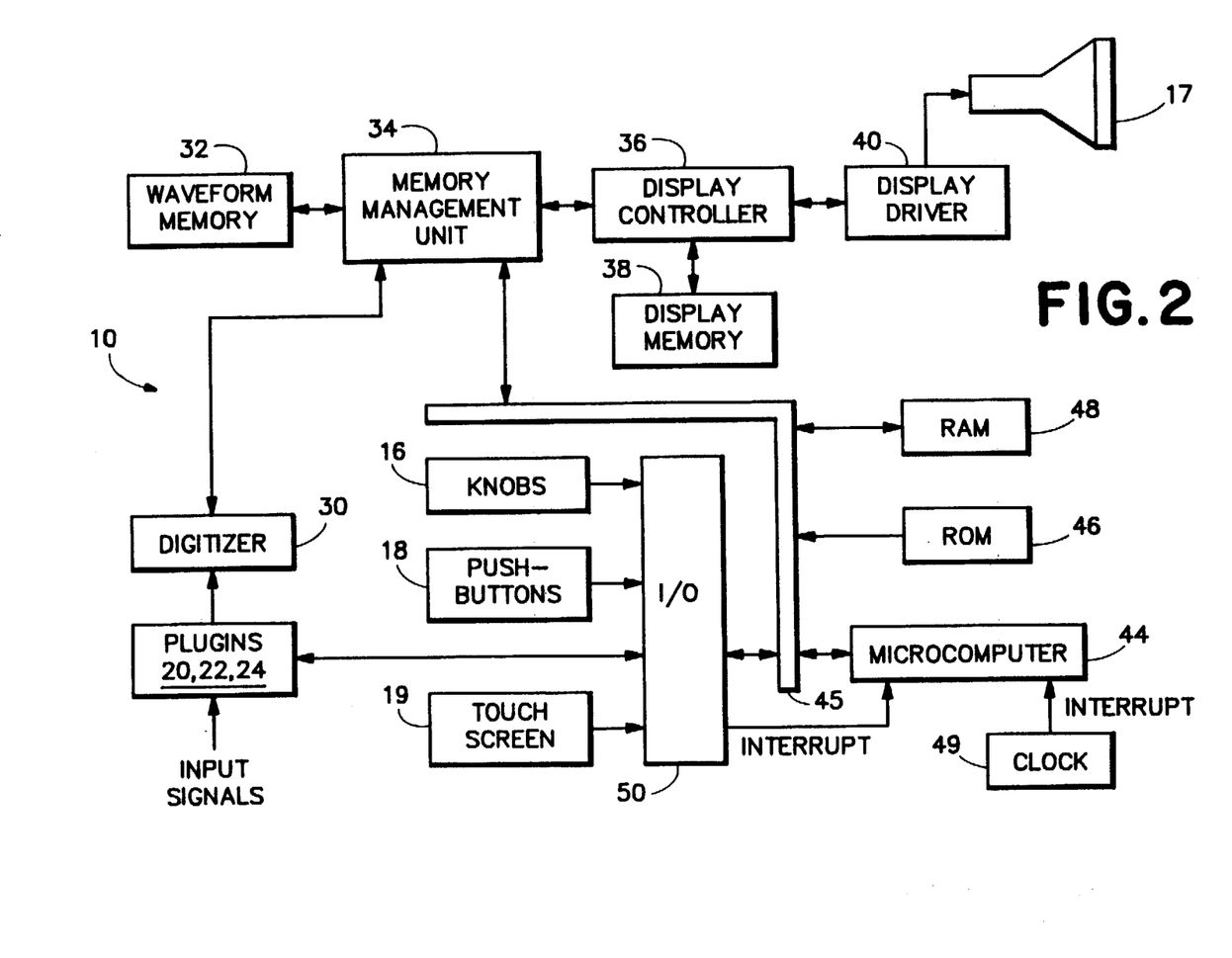
FIG. 2 is a block diagram of hardware associated with the oscilloscope of FIG. 1.

FIG. 2 is a block diagram of hardware associated with the oscilloscope 10 of FIG. 1. Signals produced by devices under test and applied as inputs to oscilloscope 10 through jacks on plugins 20, 22 and 24 are preconditioned by the plugins and applied as waveform and triggering inputs to a digitizer 30. The digitizer 30 digitizes selected input signals to produce sequences of waveform data representing the magnitude of successive input signal samples, and transmits these waveform data sequences for storage in a waveform memory 32 by way of a memory memory management unit 34 which arbitrates competing demands for access to the waveform memory 32. Memory management unit 34 is described in detail in copending U.S. patent application Ser. No. 912,024, filed Sept. 25, 1986, entitled "Concurrent Memory Access System", incorporated herein by reference. Through memory management unit 34, a display controller 36 acquires waveform data sequences stored in waveform memory 32 and utilizes these sequences to create a bit map of an oscilloscope display, the bit map being stored in a display memory 38. The display controller 36 periodically acquires bit map information from the display memory 38 and transmits it to a display driver 40 which produces a display on the cathode ray tube screen 17 of the oscilloscope 10 according to bit map data.

The memory management unit 34 also provides a microcomputer 44 with read and write access to waveform memory 32 by way of a computer bus 45 including control, data and address lines. Microcomputer 44 suitably comprises an Intel model 80286 processor and may include an Intel 80287 arithmetic coprocessor for performing fast arithmetic operations and an Intel 82258 direct memory access (DMA) controller for fast I/O operations. The microcomputer 44 operates under control of software (sometimes called "firmware") stored in a read only memory (ROM) 46 and utilizes a RAM 48 for temporary data storage, ROM 46 and RAM 48 being accessed through bus 45. Microcomputer 44 may be programmed to carry out a number of functions including, for example, the control of operating states of plugins 20, 22 and 24, digitizer 30, and display controller 36. The microcomputer 44 may provide control input signals to plugins 20, 22, and 24 through bus 45 to which the plugins are connected by means of suitable bus input/output (I/O) interface circuitry 50. Microcomputer 44 may further control digitizer 30 operating modes through commands sent over bus 45 and stored in waveform memory 32 by way of memory management unit 34, the stored commands being subsequently read out of memory 32 by digitizer 30. Microcomputer 44 determines which stored waveform data sequences display controller 36 is to display by sending commands to memory management unit 34 telling it to obtain selected waveform sequences from memory 32 and to transmit them to the display controller 36. Microcomputer 44 may also control the display of menus, graphics and data on screen 17 by storing display control data in waveform memory 32 and commanding memory management unit 34 to forward that data to the display controller 36.

Input signals, produced by operation of the oscilloscope main front panel knobs 16 and pushbuttons 18, by operation of knobs, pushbuttons or switches on the individual front panels of plugins 20, 22, or 24, and by operation of the touchscreen 19, are sensed by the I/O circuitry 50 which transmits messages to microcomputer 44 in response thereto. In response to the messages, computer 44 configures various subsystems of the oscilloscope for selected modes of operation. Firmware for controlling the display of menus and operation of microcomputer 44 in response to operation of oscilloscope front panel pushbuttons and the touchscreen is described in copending U.S. patent application Ser. No. 902,363, filed Aug. 29, 1986, entitled "Menu-based Oscilloscope Operating State Configuration System". A real time clock 49 is provided to transmit an interrupt signal to microcomputer 44 on a regular basis. The purpose of this interrupt signal will be discussed hereinbelow.

Figure 3:
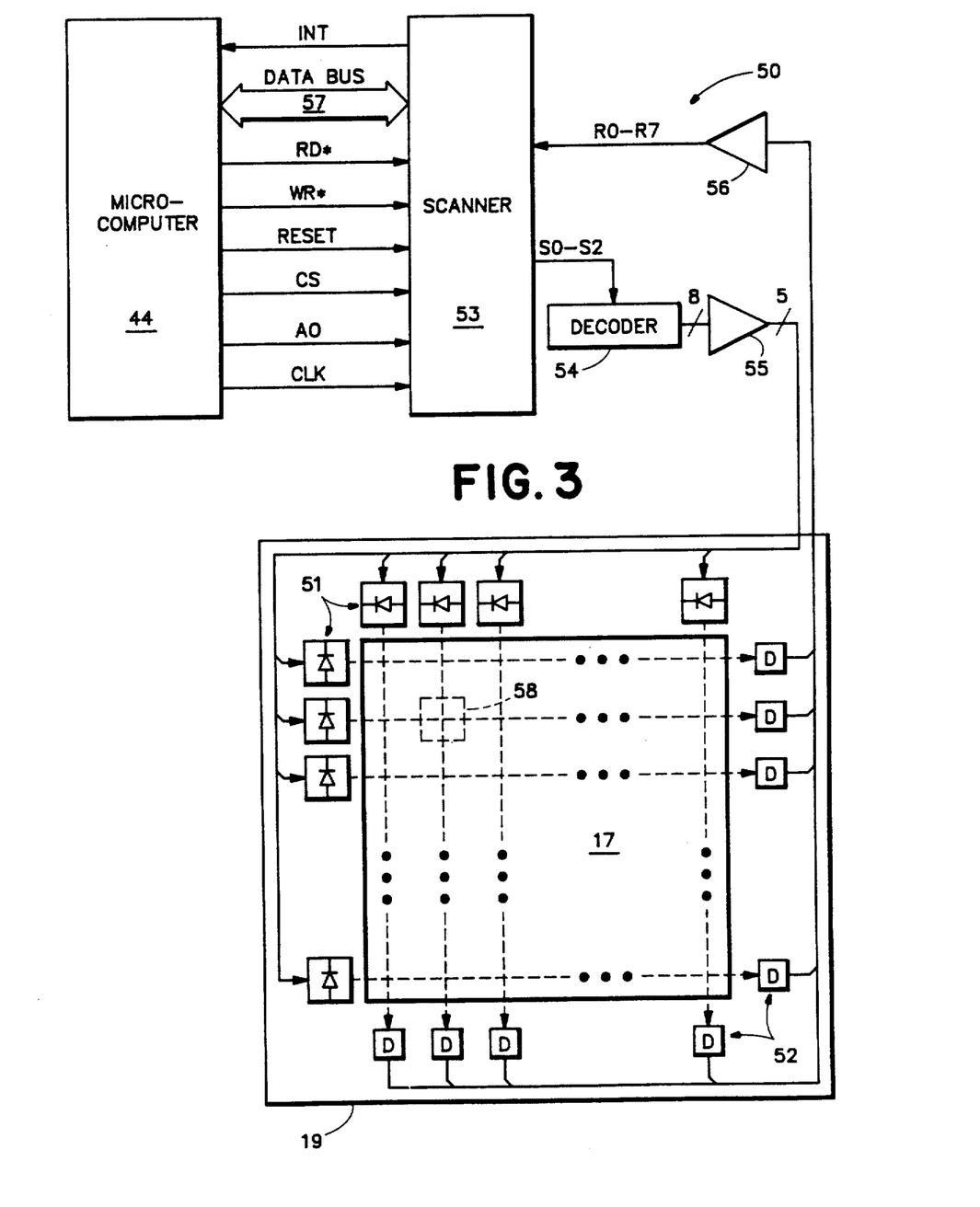
FIG. 3 is a block diagram of the touchscreen and a portion of the input/output circuitry of FIG. 2 which provides touchscreen input/output interfacing.

FIG. 3 depicts in block diagram form the interconnections between the touchscreen 19, the microcomputer 44, and a portion of the I/O circuitry 50 which provides touchscreen input/output interfacing. The touchscreen 19 includes a row of 11 light emitting diodes (LEDs) 51 mounted across the top edge of the screen 17 and a column of 22 LEDs 51 mounted along the left side of the screen. The LEDs 51 are arranged to produce an 11×2 grid of light beams immediately in front of the screen 17. A set of 33 photodetectors 52 are positioned along the bottom and right edges of the screen 17 so that a separate photodetector 52 is able to detect the light beam produced by each LED 51 when the beam reaches the edge of the screen directly opposite the LED. When the operator touches the screen, his finger may prevent one or more light beams from reaching photodetectors positioned to detect them and each photodetector 52 produces an output signal of state indicating whether the photodetector currently detects the light beam produced by the corresponding LED 51.

The I/O circuitry 50 includes a scanning circuit 53, suitably comprising an Intel Corporation model 8279 programmable keyboard interface device operating in its "sensor matrix" mode. Scanning circuit 50 produces a three bit count output (S0–S2) which is decoded by a decoder 54 to drive one of eight decoder output lines high, depending on the current count carried on lines S0–S2. Five of the eight decoder output lines are buffered by a set of buffers 55, and each of the outputs of buffers 55 are utilized to drive a separate group of up to eight of the 33 (11 horizontal and 22 vertical) LEDs 51. The output signal of each photodetector 52 is applied as an input to one of a set of eight buffers 56 and the outputs R0–R7 of buffers 56 are provided as inputs to the scanner 53.

During a scanning operation, the scanner 53 periodically increments its count output S0–S3. Each time the count output is incremented, decoder 54 energizes a separate one of its eight output lines, which in turn causes the corresponding buffer 55 to energize up to eight LEDs 51. Assuming that the operator does not interrupt any of the light beams produced by the energized LEDs, each photodetector 52 corresponding to an energized LED drives high an input to a separate one of the buffers 56 thereby driving high the output of buffer 56. When the operator's finger intercepts one of the light beams, the output of one of the photodetectors 52 is driven low, and its state will be reflected by output signal R0-R7 of one of the buffers 56. The scanner 53 includes an 8'8 bit memory for storing the state of each of the up to eight signals R0-R7 returned in response to each of the eight different values of its count output S0-S2. Once the count reaches its limit (111), it is reset to 000 and starts over. The new data R0-R7 acquired for each count value replaces the data acquired for that same count value during the previous count cycle. Thus each of 33 of the 64 data bits in the internal memory in the scanner indicates whether or not a separate one of the 33 photodetectors 52 detected a light beam during the last scanner count cycle. The remaining 31 data bits are not utilized for indicating touchscreen output signal states.

The scanner 53 also includes provisions for comparing the current states of the input signals R0-R7 produced in response to its current count output S0-S2 to the states of data stored in its internal memory when the count last had the same value. Whenever the scanner 53 determines the state of at least one of the R0-R7 signals has changed, it replaces the previously stored data with the new data, transmits an interrupt signal (INT) to microcomputer 44, and then suspends its scanning operation. When the microcomputer 44 receives the interrupt signal, it reads all 64 bits of data in the scanner memory as a sequence of 8-bit words, the data being passed to the microcomputer over an 8-bit data bus 57. The microcomputer 44 determines from this data whether and where the operator is touching the screen. Once the microcomputer has acquired and processed the scanner data, it transmits an end interrupt command to the scanner 53 which signal tells the scanner to resume its scanning operation.

Other signals provided to the scanner 53 by the microcomputer 44 include a clock signal CLK utilized by the scanner for internal timing, a RESET signal for initializing scanner operation, a chip select signal CS for enabling data bus interface circuitry within the scanner to transmit or receive data, read and write signals RD* and WD* (the * symbol means the signal is active low) for controlling the direction of data flow on bus 57, and a line A0 of the microcomputer's address bus utilized to indicate whether signals transmitted to the scanner on the data bus 57 are data or commands.

The resolution with which the microcomputer 44 determines the position of the operator's finger on screen 17 depends on the number of horizontal and vertical light beams utilized by the touchscreen mechanism 19. When one vertical and one horizontal beam is intercepted by the operator's finger, microcomputer 44 can determine that the finger is within a particular "touch zone", a rectangular area surrounding the point of intersection of the two beams, such as for example touch zone 58. Each light beam intersection thus defines the center of a separate touch zone such that the screen is divided into a grid of touch zones.

According to the present invention, the operation of the microcomputer 44 in handling touchscreen input data is controlled by a touchscreen interrupt routine and a clocked interrupt routine. The touchscreen interrupt routine is initiated when scanner 53 interrupts the microcomputer 44 in response to a change in the touchscreen output data. In executing the touchscreen interrupt routine the microcomputer 44 reads the touchscreen data stored in the scanner and sets the values of parameters to indicate the coordinates of any touch zone touched by the operator, or to indicate that the operator is not touching the screen, as determined from the touchscreen data. The clocked interrupt routine is initiated periodically, whenever the clock 49 of FIG. 2 generates an interrupt signal (suitably every 20 msec.). In executing the clocked interrupt routine, the microcomputer 44 determines if the current touch zone coordinates indicated by the parameters set during the touchscreen interrupt routine have remained the same for a predetermined number of clocked interrupts, and if so, enqueues a command in a command queue. The command includes the coordinates of the touch zone touched by the operator, or indicates that the operator has stopped touching the screen. The commands in the command queue invoke routines which cause the microcomputer 44 to respond in various ways depending on the touchscreen information conveyed in the command. Since the touchscreen input data must remain constant for a predetermined number of clocked interrupts in order for a screen touch to be considered valid, the chances of enqueuing a succession of touchscreen inputs when an operator's finger intermittently crosses a light beam are minimized.

Figure 4:
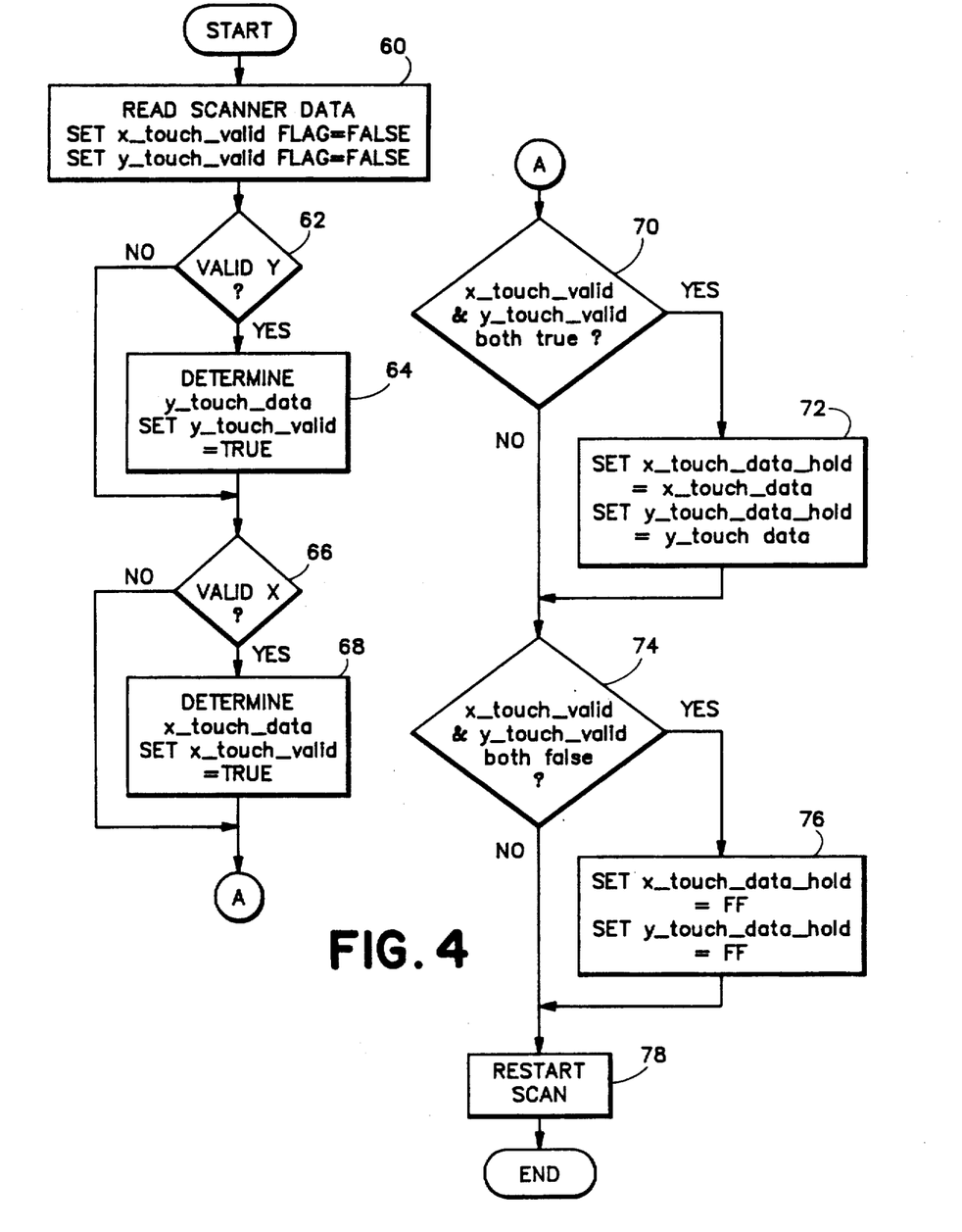
FIG. 4 is a flow chart for programming the computer of FIG. 2 to execute a touchscreen interrupt routine according to the present invention.

The touchscreen interrupt routine is depicted in flowchart form in FIG. 4, and a listing of a PLM programming language software implementation of the flowchart of FIG. 4 is included in Appendix I to this specification. With reference to FIG. 4, the touchscreen interrupt routine begins in block 60 where the microcomputer acquires the touchscreen data from the scanner and sets a pair of flags, x_touch_data_valid and y_touch_data_valid, to "false" states. Then (block 62) the microcomputer processes the touchscreen data bit-by-bit to determine if the data indicates that the operator's finger intercepted a vertical light beam, thereby indicating a "Y" coordinate of a touch zone touched by the operator. When a bit indicates that the operator's finger intercepted a vertical light beam, the microcomputer sets the value of a y_touch_data parameter to indicate the Y coordinate and sets the y_touch_valid flag to a true state (block 64). If no valid Y coordinate is found in block 62, or after executing the instructions of block 64, the microcomputer checks the touchscreen data to determine if it indicates that the operator's finger intercepted a horizontal light beam (block 66), thereby indicating an "X" coordinate of a touch zone touched by the operator. If so, the microcomputer sets the value of an x_touch_data parameter to indicate the X coordinate and sets the x_touch_valid flag to a true state (block 68).

Next (block 70) the states of the x_touch_valid and y_touch_valid flags are checked to determine if they are both true, indicating that the operator has touched a touch zone identified by the screen coordinates represented by the x_touch_data and y_touch_data parameters. In such case (block 72) the values of an x_touch_data_hold parameter and a y_touch_data_hold parameter are set equal to x_touch_data and y_touch_data, respectively. After executing block 72, or immediately after executing block 70 if the x_touch_valid and y_touch_valid flags are not both true, the microcomputer (in block 74) checks the x_touch_valid and y_touch_valid flags to determine if they are both false. If so, this indicates that the operator has just removed his finger from the screen and (in block 76) the x_touch_data_hold and y_touch_data_hold parameters are each set to the hexadecimal value FF, used to indicate that the operator is not touching the screen.

Thereafter, or after block 74 if the x_touch_valid and y_touch_valid flags are not both false, the microcomputer restarts the touchscreen scan (block 78) by sending the end interrupt command to the scanner. The touchscreen interrupt routine then ends.

Thus when executing in the touchscreen interrupt routine of FIG. 4, the microcomputer reads the touchscreen data produced by the scanner, determines from the data if the operator's finger is intercepting a horizontal and a vertical light beam, and if so, sets the values of x_touch_data_hold and y_touch_data_hold to indicate the coordinates of the touch zone touched by the operator. If no vertical beam and no horizontal beam have been intercepted, then the microcomputer sets the values of x_touch_data_hold and y_touch_data_hold each to FF to indicate that the operator is not touching the screen.

If, however, the data indicates that the operator's finger is intercepting a vertical beam, but not a horizontal beam, or is intercepting a horizontal beam but not a vertical beam, then the microcomputer does not change the values of x_touch_data_hold and y_touch_data_hold. These situations may arise when the operator touches the screen with an object such as a pencil point which is so small that it may only intercept a vertical beam but not a horizontal beam, or vice versa. It also arises due to the manner in which the scanner operates. Recall that the scanner reads not more than eight photodetector output signals at a time and stops its scanning operation whenever it detects a change in output of the currently scanned photodetectors. When an operator touches the screen, his finger may intercept a horizontal and a vertical beam but photodetector output signals responsive to these light beams may not be read during the same scanner count cycle. When the scanner reads, for example, the photodetector output signal representing the state of the intercepted vertical beam first, the scanner updates its stored touchscreen data for the change in that output signal and then interrupts the microcomputer and stops its scan. It does not update the stored data for the change in the state of the photodetector output signal representing the state of the horizontal beam until after the microcomputer has read the touchscreen data and transmitted the end interrupt command to the scanner. Thus at one point it appears to the microcomputer that only a vertical beam has been intercepted, and according to the touchscreen interrupt routine of FIG. 4, the microcomputer makes no change to the previous values of x_touch_data_hold and y_touch_data_hold. After the scanner resumes its scanning operation it detects the change in the output signal of the photodetector associated with the intercepted horizontal beam, changes the touchscreen data accordingly, and again interrupts the microcomputer. This time the touchscreen data read by microcomputer indicates that both horizontal and vertical beams have been intercepted, and the microcomputer updates the values of x_touch_data_hold and y_touch_data_hold accordingly. Thus the touch-screen interrupt routine alters the value of the x_touch_data_hold and y_touch_data_hold parameters only when it can determine the coordinates of a touch zone touched by the operator or when it determines that the operator has stopped touching the screen.

Figure 5:
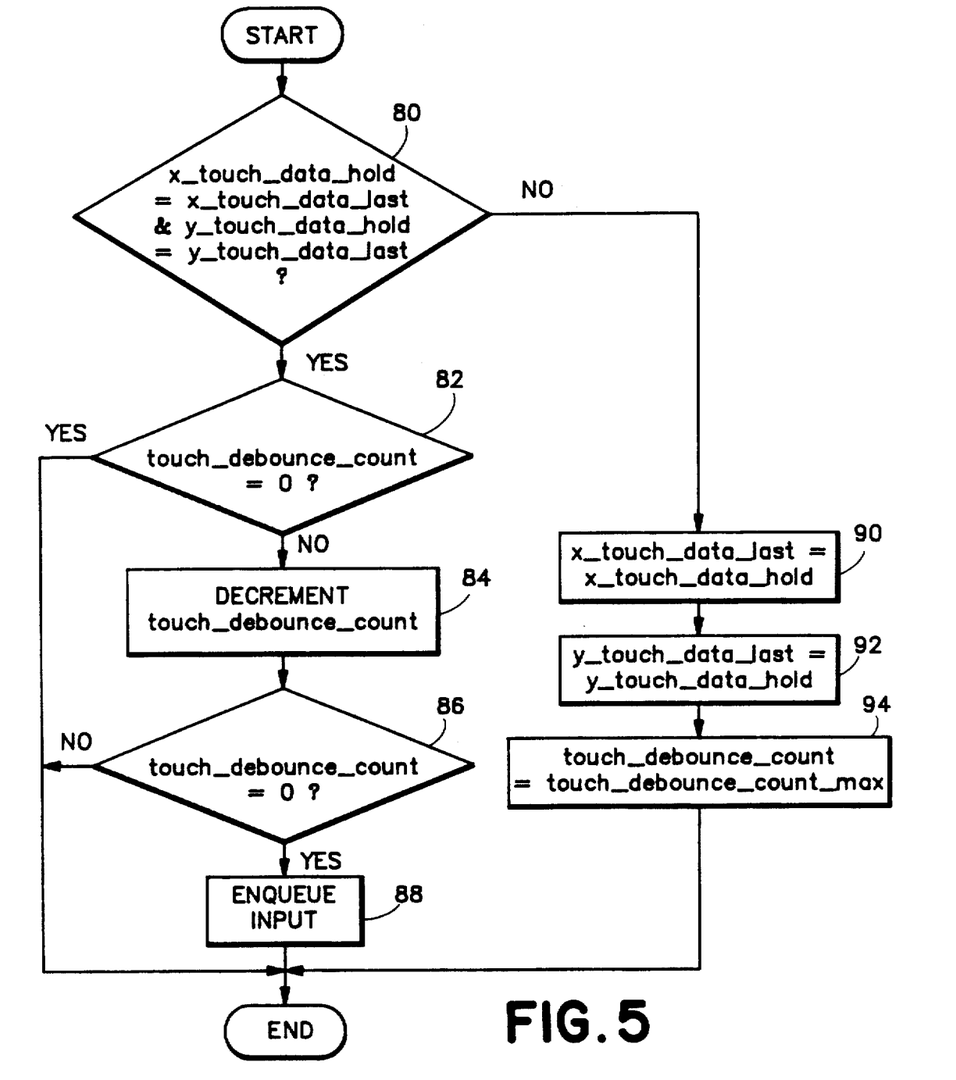
FIG. 5 is a flow chart for programming the computer of FIG. 2 to execute a clocked interrupt routine according to the present invention.

The clocked interrupt routine is depicted in flow chart form in FIG. 5 and a listing of a PLM programming language software implementation of the flowchart of FIG. 5 is included as Appendix II to this specification. With reference to FIG. 5, the clocked interrupt routine begins in block 80 where the current value of the x_touch_data_hold parameter is compared to the value of an x_touch_data_last parameter and the current value of the y_touch_data_hold parameter is compared to the value of a y_touch_data_last parameter. The x_touch_data_last and y_touch_data_last parameters have values which are equal to previous values of the x_touch_data_hold and y_touch_data_hold parameters as of the last time the clocked interrupt subroutine was initiated. If the current value of x_touch_data_hold is not equal to the value of x_touch_data_last and the current value of y_touch_data_hold is not equal to the value of y_touch_data_last, then a change in the touchscreen input has been detected by the scanner and acknowledged by the touchscreen interrupt routine since the last time the clocked subroutine was executed. In such case (blocks 90 and 92) the x_touch_data_last parameter is set equal to the current value of x_touch_data_hold and the y_touch_data_last parameter is set equal to the current value of y_touch_data_hold and (block 94) an integer variable, touch_debounce_count, is set to a maximum value (touch_debounce_count max). Thereafter the clocked interrupt routine ends.

However, if the current values of x_touch_data_hold and y_touch_data_hold are the same as they were the last time the clocked interrupt routine was executed (block 80), then the touch_debounce_count variable is checked to see if it is equal to 0 (block 82). If it is, the clocked interrupt routine ends without further action. If not, the touch_debounce_count variable is decremented by one if the count is greater than 0 (block 84) and then again checked (block 86) to see if it is 0. If the touch_debounce_count variable is not equal to 0, the routine ends. If touch_debounce_count is equal to 0, a subroutine is called which enqueues a command for causing the microcomputer to take an appropriate response to the operator's touch of the touch zone indicated by the current values of x_touch_data_hold and y_touch_data_hold, or alternatively, when the x_touch_data_hold and y_touch_data_hold parameters have values FF, to take an appropriate response to the operator's removal of his finger from the screen.

When the value of touch_debounce_count_max utilized in block 94 is set, for example, to 10 the x_touch_data_hold and y_touch_data_hold parameters must remain unchanged by the touchscreen interrupt routine for 10 consecutive clock interrupts before the clocked interrupt routine enqueues a command causing the microcomputer to carry out an action in response to a screen touch (or in response to termination of a screen touch). This ensures that when the edge of the operator's finger is so close to one or more light beams that the repeated interrupts caused by the natural shaking of his finger do not cause a succession of commands to be enqueued. It also ensures that a succession of commands are not enqueued when the operator rapidly moves his finger across the screen. The decisions in blocks 82 and 86 ensure that one command is enqueued after the touchscreen input has remained constant for 10 clocked interrupts and that no further commands are enqueued as long as the touchscreen input continues to remain constant. When the value of touch_debounce_count_max is set to 10, and when the clocked interrupt routine is executed every 20 milliseconds, the clocked interrupt routine enqueues a command to respond to a valid touchscreen operation about 0.2 seconds after the touchscreen operation.

The present invention is particularly suitable for use in conjunction with the digital oscilloscope shown in FIGS. 1 and 2 wherein aspects of oscilloscope operation may be controlled by the operator utilizing the touchscreen to make selections from menus displayed on the oscilloscope screen. In such a digital oscilloscope, the microcomputer 44 controls update of waveform displays in response to changes in input signals, as well as the display of menus on the screen and the oscilloscope's response to touchscreen selections made from such menus. In order to provide substantially real-time waveform display update in response to changes in input signals to the digital oscilloscope, it is beneficial to minimize the amount of processing time expended in monitoring the touchscreen when the operator is not using it.

The touch screen interrupt routine utilizes relatively more processing time than the clocked interrupt routine because it requires microcomputer 44 to acquire a comparatively larger amount of data and requires the microcomputer to process all of the data to determine the coordinates of the current screen touch. In contrast, the clocked interrupt routine requires the microcomputer to make comparatively few memory accesses and to execute relatively few lines of code. When the operator is not accessing the touchscreen, the microcomputer periodically executes the short clocked interrupt routine but does not execute the long touchscreen interrupt routine. Thus the processing time expended on touchscreen monitoring is minimized during periods when high speed update of waveform displays is most desirable, i.e., when the oscilloscope is not utilizing the screen for displaying menus and responding to menu item selections. On the other hand, when the operator is actively reconfiguring oscilloscope operation by utilizing the touchscreen to make selections from menus displayed on the screen, the speed with which waveform displays are updated is not particularly important since some waveforms may be covered by menus and since the operator's attention is directed to menus and not to waveforms. Thus by dividing software which controls microcomputer response to touchscreen input into a comparatively long touchscreen interrupt routine executed only when touchscreen input data is changing and a comparatively short clocked interrupt routine executed on a regular basis, degradation of apparent real time response of the oscilloscope due to touchscreen monitoring overhead is minimized.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

APPENDIX I

```
frp_interrupt: procedure interrupt 24h public;
    declare x_touch_data    byte;
    declare y_touch_data    byte;
    declare ct              word;
    declare kt              word;
    declare ikt             integer;
    declare grid(8)         byte;
        declare value           byte;
        declare x_touch_valid   byte;
        declare y_touch_valid   byte;
    output(FRP_CMD_PORT) = READ_FRP;
        do ct=0 to 10; end;
    do ct=0 to 7;
        grid(ct) = input(FRP_DATA_PORT);
            do kt = 0 to 10; end;
    end;
        grid(1)=grid(1) and 0fch;
        grid(5)=grid(5) and 007h;
        grid(6)=grid(6) or 0c0h;
        grid(7)=grid(7) or 0f0h;
        y_touch_valid = FALSE;
        x_touch_valid = FALSE;
            value=0;
            do ct=1 to 3;
                do ikt=0 to 7;
                    if (grid(ct) and bit_test(ikt)) <> 0 then do;
                        y_touch_data = value - 2;
                        y_touch_valid=TRUE;
                    end;
                    value = value + 1;
                end;
            end;
            value = 0;
            do ct=4 to 5;
                do ikt=0 to 7;
                    if (grid(ct) and bit_test(ikt)) <> 0 then do;
                        x_touch_data = 10 - value;
                        x_touch_valid=TRUE;
                    end;
                    value = value + 1;
                end;
            end;
        if (x_touch_valid = TRUE) and (y_touch_valid = TRUE) then do;
            x_touch_data_hold=x_touch_data;
            y_touch_data_hold=y_touch_data;
```

APPENDIX I -continued

```
        end; else do;
            if (x_touch_valid = FALSE)
                and (y_touch_valid = FALSE then do;
                    x_touch_data_hold = INVALID;
                    y_touch_data_hold = INVALID;
            end;
        end;
    /* Start the touch screen scanning again */
    output(FRP_CMD_PORT) = STRT_SCAN;
end frp interrupt;
```
Copyright 1986 Tektronix, Inc.

APPENDIX II

```
timer_interrupt: procedure interrupt 38h public;
    declare ct word;
        if (x_touch_data_hold = x_touch_data_last and
            y_touch_data_hold = y_touch_data_last) then do;
                if (touch_debounce_count > 0) then do;
                    touch_debounce_count = touch_debounce-count-1
                        if (touch_debounce_count = 0) then do;
                    call input_enqueue (x_touch_data_hold,
                        y_touch_data_hold)
                end;
        end;
    end; else do;
        x_touch_data_last = x_touch_data_hold;
        y_touch_data_last = y_touch_data_hold;
        touch_debounce_count = touch_debounce_count_max;
    end;
end timer_interrupt;
```
Copyright 1986 Tektronix, Inc.

We claim:

1. For an instrument comprising a computer, means for producing a plurality of output signals, and interface means for storing data indicating the states of said output signals, for transmitting and interrupt signal to said computer whenever the state of any one of said output signals changes, and for transferring said data to said computer, a method for said computer for acquiring and responding to said data, the method comprising the steps of:

a. acquiring said data stored by said interface means upon each receipt of said interrupt signal, and setting the value of a first parameter to represent the state of at least one of said plurality of output signals as indicated by said data;

b. concurrently with performing step a, periodically determining whether the value of said first parameter has remained constant for a predetermined period; and c. initiating a selected action after the first parameter is determined in step b to have remained constant for said predetermined period, said action being selected according to the value of said first parameter.

2. For an oscilloscope comprising a screen, a computer, touchscreen means for transmitting a first plurality of light beams in a first direction across and proximate to the surface of said screen, for transmitting a second plurality of light beams in a second direction across and proximate to the surface of said screen, said first and second directions being nonparallel, and for producing a plurality of output signals, each corresponding to a separate one of said light beams and indicating whether or not the corresponding light beam strikes an object proximate to the surface of said screen, and scanning means for repeatedly scanning states of said plurality of output signals, for storing data indicating the last scanned states of said output signals, and for transmitting an interrupt signal to said computer whenever the state of any one of said output signals changes between scans, a method for said computer for selecting and initiating at least one action, the method comprising the steps of:

a. acquiring said data stored by said scanning means upon each receipt of said interrupt signal and, when the data indicates that a first light beam of said first plurality of light beams and a second light beam of said second plurality of light beams have both struck an object proximate to said screen, setting the value of first parameters to identify said first and second light beams and when the data indicates that no light beams have struck an object, setting the values of said first parameters to predetermined values;

b. concurrently with performing step a, periodically determining whether the values of said first parameters have remained constant for a predetermined period; and c. selecting and initiating said at least one action when the values of said first parameters are determined in step b to have remained constant for said predetermined period, said at least one action being selected according to the values of said first parameter.

* * * * *